United States Patent
Ding et al.

(10) Patent No.: US 11,637,149 B2
(45) Date of Patent: Apr. 25, 2023

(54) ARRAY SUBSTRATE, DISPLAY DEVICE AND SPATIAL POSITIONING METHOD OF DISPLAY DEVICE

(71) Applicant: BOE TECHNOLOGY GROUP CO., LTD., Beijing (CN)

(72) Inventors: Xiaoliang Ding, Beijing (CN); Xue Dong, Beijing (CN); Haisheng Wang, Beijing (CN); Yingming Liu, Beijing (CN); Pengpeng Wang, Beijing (CN); Yangbing Li, Beijing (CN); Jiabin Wang, Beijing (CN); Ping Zhang, Beijing (CN); Likai Deng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 565 days.

(21) Appl. No.: 16/639,282

(22) PCT Filed: Jul. 24, 2019

(86) PCT No.: PCT/CN2019/097549
§ 371 (c)(1),
(2) Date: Feb. 14, 2020

(87) PCT Pub. No.: WO2020/020246
PCT Pub. Date: Jan. 30, 2020

(65) Prior Publication Data
US 2020/0266242 A1     Aug. 20, 2020

(30) Foreign Application Priority Data

Jul. 24, 2018    (CN) .................. 201810822085.X

(51) Int. Cl.
*G01C 3/08*     (2006.01)
*H01L 27/32*    (2006.01)
(Continued)

(52) U.S. Cl.
CPC ............ *H01L 27/322* (2013.01); *G01S 17/26* (2020.01); *H01L 27/3227* (2013.01); *H01L 27/3232* (2013.01); *H01L 51/5271* (2013.01)

(58) Field of Classification Search
CPC ......... G01S 7/51; G01S 17/26; H01L 51/5271
See application file for complete search history.

(56) References Cited

U.S. PATENT DOCUMENTS

| 9,105,546 B2 | 8/2015 | Velichko et al. |
| 2012/0044093 A1* | 2/2012 | Pala .................. G01S 17/86 340/963 |
| 2018/0284496 A1* | 10/2018 | Chen .................. G02F 1/13476 |

FOREIGN PATENT DOCUMENTS

| CN | 101813994 A | 8/2010 |
| CN | 103369339 A | 10/2013 |

(Continued)

OTHER PUBLICATIONS

Office Action dated May 22, 2020 for application No. CN201810822085.X with English translation attached.

*Primary Examiner* — Mark Hellner
(74) *Attorney, Agent, or Firm* — Nath, Goldberg & Meyer; Joshua B. Goldberg

(57) ABSTRACT

Embodiments of the present disclosure provide an array substrate, a display device and a spatial positioning method of a display device. The display device includes a base substrate, a pixel layer arranged at a side of the base substrate, a light source structure having a same light exit direction as the pixel layer, a processing element. The light source structure emits collimation invisible light, the pixel layer includes a plurality of sub-pixels and at least one sensing pixel arranged between the sub-pixels, the at least one sensing pixel receives reflected light of the collimation invisible light emitted by the light source structure and reflected by an object to be positioned, the processing (Continued)

element is coupled with the sensing pixel and the light source structure, a distance from the object to the display device is calculated according to relevant data information of the collimation invisible light and the reflected light.

18 Claims, 7 Drawing Sheets

(51) Int. Cl.
*H01L 51/52* (2006.01)
*G01S 17/26* (2020.01)

(56) References Cited

FOREIGN PATENT DOCUMENTS

| | | | | |
|---|---|---|---|---|
| CN | 105893992 A | 8/2016 | | |
| CN | 105990378 A | 10/2016 | | |
| CN | 106874866 A | 6/2017 | | |
| CN | 107316885 A | 11/2017 | | |
| CN | 107507592 A | 12/2017 | | |
| CN | 108110017 A | 6/2018 | | |
| CN | 109001927 A | 12/2018 | | |
| JP | 2008262204 A | * 10/2008 | ........... | G02F 1/1335 |
| JP | 2018036314 A | 3/2018 | | |

* cited by examiner

ARRAY SUBSTRATE, DISPLAY DEVICE AND SPATIAL POSITIONING METHOD OF DISPLAY DEVICE

CROSS-REFERENCE TO RELATED APPLICATIONS

The present application is a U.S. National Stage Application under 35 U.S.C. § 371 of International Patent Application No. PCT/CN2019/097549, filed on Jul. 24, 2019, which claims priority to China Patent Application No. 201810822085.X, filed on Jul. 24, 2018, the disclosure of both which are incorporated by reference herein in entirety.

TECHNICAL FIELD

The present disclosure relates to, but is not limited to, the field of display and computer technologies, and in particular, to an array substrate, a display device, and a spatial positioning method of a display device.

BACKGROUND

Instruments or devices for spatial positioning or three-dimensional (3D) position detection in present market need to be configured with special hardware facilities and loaded with functional software for performing spatial positioning or 3D position detection, which is relatively high in cost and additionally occupies a certain space, so that an application range of such devices is greatly influenced by physical positions, and a relatively poor practicability is resulted.

SUMMARY

An embodiment of the present disclosure provides an array substrate, including a base substrate, a pixel layer provided at a side of the base substrate and a light source structure having a light exit direction the same as that of the pixel layer, the light source structure is configured to emit collimation invisible light, the pixel layer include a plurality of sub-pixels and at least one sensing pixel provided between the sub-pixels, the at least one sensing pixel is configured to receive reflected light of the collimation invisible light reflected by an object to be positioned.

In some implementations, the pixel layer includes a plurality of sensing pixels arranged in an array between the sub-pixels, the light source structure includes a plurality of light sources arranged in an array and corresponding to the sensing pixels one to one, and a collimating optical layer disposed at a light exit side of the light sources, the light sources are configured to emit invisible light, and the collimating optical layer is configured to convert the invisible light incident on the collimating optical layer into the collimation invisible light.

In some implementations, the light source structure and the pixel layer are respectively disposed on different sides of the base substrate, and the light source structure, the base substrate and the pixel layer are sequentially disposed along the light exit direction of the light source structure.

An embodiment of the present disclosure further provides a display device, which includes any one of the array substrates as described above, and a processing element respectively coupled to the light source structure and the sensing pixel in the array substrate, where the processing element is configured to calculate a distance from an object to be positioned to the display device according to relevant data information of the collimation invisible light emitted by the light source structure and the reflected light, which is received by the sensing pixel, of the collimation invisible light reflected by the object to be positioned.

In some implementations, the processing element is coupled to each light source in the light source structure, the processing element is further configured to modulate the invisible light emitted by each light source, so that frequencies of invisible light emitted by each line of light sources in the light source structure along a first direction are different from each other, the sensing pixel is further configured to demodulate the received reflected light to obtain optoelectronic information, and the sensing pixel has a demodulation frequency equivalent to a modulation frequency of a corresponding light source.

In some implementations, the light source is configured to emit pulse invisible light, the processing element is configured to control the sensing pixel to perform a first demodulation and a second demodulation on the received reflected light, and a phase difference between the first demodulation and the second demodulation is ¼ of a pulse period, so as to calculate the distance from the object to be positioned to the display device according to $2S=¼Fi*c*A/(A+B)$, where S is the distance from the object to be positioned to the display device, and Fi is the modulation frequency of the invisible light emitted by the $i^{th}$ light source in the first direction, A is the optoelectronic information obtained by the first demodulation of the sensing pixel, B is the optoelectronic information obtained by the second demodulation of the sensing pixel, and c is a light speed of the pulse invisible light.

In some implementations, the processing element is further configured to sequentially turn on each line of light sources along the first direction.

In some implementations, the display device further includes a shift register disposed in a non-display area and coupled to each light source, the shift register being configured to sequentially turn on each line of light sources along the first direction.

In some implementations, the processing element is further configured to sequentially turn on each line of sensing pixels along the first direction, so that each of the sensing pixels receives and demodulates the reflected light of the invisible light emitted by the corresponding light source and reflected by the object to be positioned.

In some implementations, the processing element is further configured to turn on the sensing pixels of a same line along a second direction simultaneously, so that the sensing pixel corresponding to the turned-on light source and the sensing pixels in a same line along the second direction as the corresponding sensing pixel simultaneously receive and demodulate the reflected light of the invisible light emitted by the turned-on light source and reflected by the object to be positioned, so as to calculate the distance from the object to be positioned to the display device according to $S=(Si+a1*Si1+a2*Si2+ \ldots +ax*Six)/(1+x)$, where S is the distance from the object to be positioned to the display device, Si is the distance calculated by the sensing pixel corresponding to the $i^{th}$ turned-on light source in the first direction, Si1 through Six are respective distances calculated by the sensing pixels in the same line along the second direction as the corresponding sensing pixel, and a1 to ax are respective coefficients for mapping Si1 through Six to Si, the second direction is perpendicular to the first direction, and frequencies of the invisible light emitted by light sources in each line along the second direction are the same with each other.

An embodiment of the present disclosure further provides a spatial positioning method of a display device, where an array substrate of the display device includes a base substrate, at least one sensing pixel disposed at a side of the base substrate and in a pixel layer, and a light source structure having a light exit direction the same as that of the pixel layer, and the method includes: acquiring relevant data information of collimation invisible light emitted by the light source structure and reflected light, which is received by the sensing pixel, of the collimation invisible light reflected by an object to be positioned; and calculating the distance from the object to be positioned to the display device according to the acquired data information.

In some implementations, the pixel layer includes a plurality of sensing pixels arranged in an array between a plurality of sub-pixels, the light source structure includes a plurality of light sources arranged in an array and corresponding to the sensing pixels one to one, and a collimating optical layer disposed at a light exit side of the light sources, and the method further includes: modulating the invisible light emitted by each light source such that frequencies of the invisible light emitted by the light sources of the light source structure along the first direction are different from each other, where the acquired relevant data information of the reflected light received by the sensing pixel includes the optoelectronic information obtained by demodulating the reflected light received by the sensing pixel.

In some implementations, the light source emits pulse invisible light, the method further includes: controlling the sensing pixel to perform a first demodulation and a second demodulation on the received reflected light, where a phase difference between the first demodulation and the second demodulation is ¼ of a pulse period, and calculating the distance from the object to be positioned to the display device according to $2S=\frac{1}{4}Fi*c*A/(A+B)$, where S is the distance from the object to be positioned to the display device, is a modulation frequency of the invisible light emitted by the $i^{th}$ light source in the first direction, A is optoelectronic information obtained by performing the first demodulation through the sensing pixel, B is optoelectronic information obtained by performing the second demodulation through the sensing pixel, and c is a light speed of the pulse invisible light.

In some implementations, the spatial positioning method further includes: sequentially turning on each line of light sources along the first direction.

In some implementations, the spatial positioning method further includes: sequentially turning on each line of sensing pixels along the first direction, so that each sensing pixel receives and demodulates the reflected light of the invisible light emitted by the corresponding light source and reflected by the object to be positioned.

In some implementations, the spatial positioning method further includes: simultaneously turning on the sensing pixels of a same line along a second direction, so that the sensing pixel corresponding to the turned-on light source and the sensing pixels in a same line along the second direction as the corresponding sensing pixel simultaneously receive and demodulate the reflected light of the invisible light emitted by the turned-on light source and reflected by the object to be positioned, and calculating the distance from the object to be positioned to the display device according to $S=(Si+a1*Si1+a2*Si2+ \ldots +ax*Six)/(1+x)$, where S is the distance from the object to be positioned to the display device, Si is the distance calculated by the sensing pixel corresponding to the $i^{th}$ turned-on light source in the first direction, Si1 through Six are respective distances calculated by the sensing pixels in the same line along the second direction as the corresponding sensing pixel, and a1 to ax are respective coefficients for mapping Si1 through Six to Si, the second direction is perpendicular to the first direction, and frequencies of the invisible light emitted by light sources in each line along the second direction are the same with each other.

An embodiment of the present disclosure further provides a computer device, including a memory and a processor, where the memory is configured to store executable instructions, and the processor is configured to implement the spatial positioning method of display device as described above when executing the executable instructions stored in the memory.

An embodiment of the present disclosure further provides a computer-readable storage medium storing executable instructions that, when executed, the spatial positioning method of display device as described above is implemented.

DESCRIPTION OF DRAWINGS

The accompanying drawings are included to provide a further understanding of technical solutions of the present disclosure, constitute a part of specification, and explain the technical solutions of the present disclosure together with embodiments of the present disclosure, but the technical solutions of the present disclosure are not limited thereto.

DESCRIPTION OF EMBODIMENTS

In order to make the technical solutions and advantages of the present disclosure more apparent, embodiments of the present disclosure will be described in detail below with reference to the accompanying drawings. It should be noted that the embodiments and features of the embodiments in the present application may be arbitrarily combined with each other without conflict.

The steps illustrated by the flowcharts of the drawings may be performed in a computer system, for example, by a set of computer-executable instructions. Also, while an order of the steps is shown in the flowcharts, in some cases, the steps may be performed in another order different from that shown.

Since the instruments or devices for performing spatial positioning or 3D position detection in the related art need to be configured with special hardware facilities and additionally occupy a certain space, the application range of such devices is greatly affected by the physical position and a poor practicability is resulted. With the development of display technology, display devices are widely used in various places in homes and public places as tools and entertainment facilities indispensable to people's daily lives. Based on the wide application of the display device, embodiments of the disclosure provide a solution for integrating the spatial positioning capability in the display device.

Several specific embodiments provided in the present disclosure may be combined with each other, and details of the same or similar concepts or processes may not be repeated in some embodiments.

Figure 1:
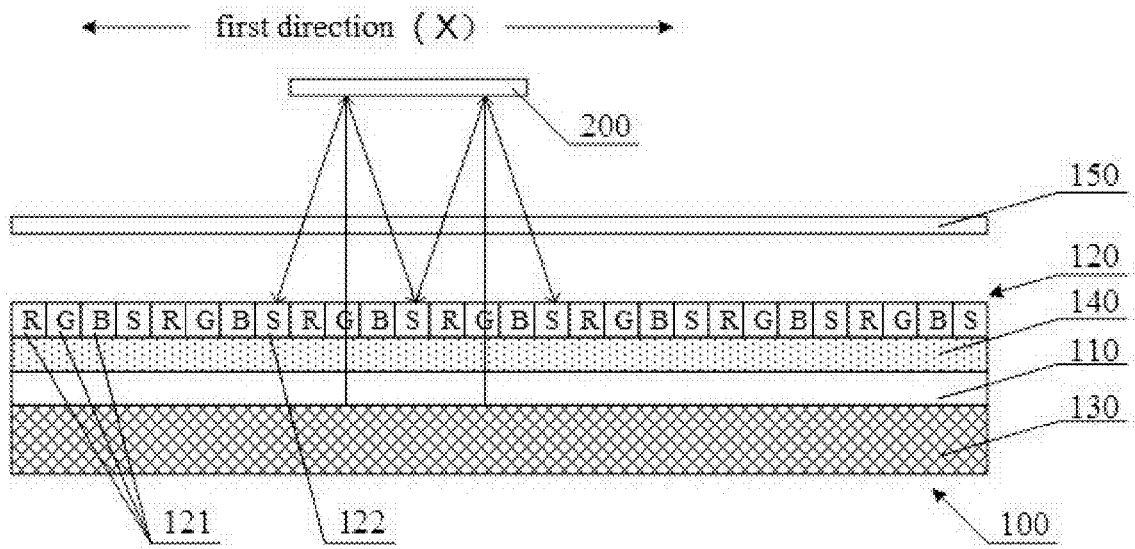
FIG. 1 is a schematic structural diagram of an array substrate according to an embodiment of the present disclosure.

FIG. 1 is a schematic structural diagram of an array substrate according to an embodiment of the present disclosure. The array substrate 100 provided in this embodiment may be used to form a display panel. The array substrate 100 may include a base substrate 110, a pixel layer 120 disposed on a side of the base substrate 110, and a light source structure 130 having the same light exit direction as the pixel layer 120.

The light source structure 130 may be used to emit collimation invisible light.

The pixel layer 120 may include sub-pixels 121 and at least one sensing pixel 122 disposed between the sub-pixels 121. The sub-pixels 121 in the embodiments of the present disclosure are illustrated by taking Red, Green, and Blue (abbreviated as RGB) sub-pixels as an example, and the sensing pixel 122 is denoted by S.

The sensing pixel 122 is configured to receive a reflected light of the collimation invisible light emitted from the light source structure 130 and reflected by the object to be positioned, so as to determine the position of the object to be positioned.

FIG. 1 is a cross-sectional view of an array substrate 100 taken along a first direction, and FIG. 1 shows an object 200 to be positioned, the object 200 to be positioned being located at a light exit side of the array substrate 100. The light source structure 130 in the embodiment of the present disclosure may be disposed at a side of the base substrate 110 away from the pixel layer 120, and the light source structure 130 may emit collimation invisible light. Collimation light has strong directivity so that measurement with high precision can be realized. The invisible light does not affect the normal display of the array substrate 100 when used for displaying. That is to say, the array substrate 100 can realize the display function through the sub-pixels 121, for example, the sub-pixels 121 may be light-emitting sub-pixels 121 (emitting visible light), the light source structure 130 is disposed for realizing spatial positioning, and the light emitted by the light source structure 130 cannot affect the normal display of the array substrate 100 when used for displaying, so the light source structure 130 may be configured to emit invisible light, for example, infrared light which is not harmful to human body may be emitted. Moreover, the light exit direction of the light source structure 130 is the same as the light exit direction of the pixel layer 120. It should be understood that the array substrate 100 emits light from one side for a user to view, that is, the light exit direction of the light source structure 130 and the light exit direction of the pixel layer 120 may both be directed to the user.

In the embodiment of the present disclosure, the pixel layer 120 of the array substrate 100 includes not only the sub-pixels 121 for displaying, but also the sensing pixels 122 disposed between the sub-pixels 121, where the sensing pixels 122 serve as receiving ends corresponding to the light source structures 130 (emitting ends), and can receive reflected light that is emitted by the light source structures 130 and reflected when irradiating on the object 200 to be positioned (for example, a viewing user), and the reflected light may be light that is returned after the collimation invisible light emitted by the light source structures 130 is diffusely reflected on the object 200 to be positioned.

The embodiment of the present disclosure employs the light source structure 130 emitting the collimation invisible light and the sensing pixel 122 receiving the reflected light of the collimation invisible light reflected by the object to be positioned, and the light path, along which the collimation invisible light emitted by the light source structure 130 reaches the sensing pixel 122 after being reflected by the object 200 to be positioned, is the round-trip light path of the collimation invisible light. When the array substrate 100 provided in the embodiment of the disclosure is applied to a display device, a processor configured in the display device, for example, an Integrated Circuit (IC) chip, can calculate a distance from the object 200 to be positioned to the display device by measuring the round-trip light path, for example, timings at which light is emitted and received may be measured. It should be understood that the processor may be coupled to the light source structure 130, so as to acquire the timing at which the collimation invisible light is emitted, and the processor may be coupled to the sensing pixel 122, so that when the sensing pixel 122 receives the reflected light, the timing of receiving the reflected light may be fed back to the processor, and the processor may calculate a distance from the object 200 to be positioned to the display device according to known data information.

In practical applications, the object 200 to be positioned may be a large-sized object, and a plurality of sensing pixels 122 may be disposed to perform spatial positioning, in such case, the sensing pixels 122 receive reflected light emitted by the light source structure 130 and reflected by the object 200 to be positioned, and the processor may calculate the spatial position of the object 200 to be positioned according to a round-trip light path through which the reflected light received by the sensing pixels 122 passes.

In the embodiment of the present disclosure, the light source structure 130 and the pixel layer 120 may be disposed at different sides of the base substrate 110, and FIG. 1 illustrates the light source structure 130 and the pixel layer 120 as being disposed at different sides of the base substrate 110, respectively, however, the light source structure 130 and the pixel layer 120 may also be disposed at a same side of the base substrate 110. The array substrate of the embodiment of the present disclosure may be used to form a Liquid Crystal Display (LCD), a top emission Organic electroluminescent. Display (OLED), or a bottom emission OLED, for example. In some implementations, the array substrate 100 may further include a Thin Film Transistor (TFT) for controlling on/off of the sub-pixel 121, an electrode layer 140, an encapsulation layer 150, and the like.

Compared with the related art, the array substrate 100 provided by the embodiment of the present disclosure is integrated with a hardware structure for implementing a spatial positioning function, and the hardware structure for implementing the spatial positioning function does not affect normal display of the array substrate 100 when used for displaying, and the spatial positioning function is operated independently. The array substrate 100 provided by the embodiment of the present disclosure is applied to 3D display interaction scenes, for example, scenes such as motion sensing games, and no additional hardware facility for spatial positioning needs to be provided, so that on one hand, cost for additionally configuring hardware facilities is saved, on the other hand, limitation of a spatial range on 3D display interaction can be reduced as much as possible, and practicability of the array substrate 100 is improved.

According to the array substrate 100 provided by the embodiment of the present disclosure, the sensing pixels 122 are arranged between the sub-pixels 121 of the pixel layer 120, the light source structure 130 which has the same light exit direction as the pixel layer 120 and can emit the collimation invisible light is disposed, the sensing pixels 122 can receive the reflected light of the collimated invisible light emitted by the light source structure 130 and reflected by the object 200 to be positioned, when the array substrate 100 is applied to a display device, a processor configured in the display device can calculate the distance from the object 200 to be positioned to the display device according to the relevant data information of the collimated invisible light emitted by the light source structure 130 and the reflected light received by the sensing pixels 122, and thus, the spatial positioning is realized. The array substrate 100 provided by the embodiment of the present disclosure is reasonably reformed from the structure of the conventional array substrate, and the structure and function for realizing the spatial positioning are integrated in the array substrate 100, so when the array substrate 100 is applied to a display device, the array substrate 100 can assist a processor in the display device for performing the spatial positioning while being used for normal display, and the array substrate 100 has a simple structure and is easy to be implemented, and hardware structure for the spatial positioning does not additionally occupy space. In addition, the invisible light may be infrared light that is harmless to a human body, which is beneficial for a user to perform 3D display interaction with a display device to which the array substrate 100 belongs.

In the embodiment of the present disclosure, in the case that a plurality of sensing pixels 122 are disposed in the pixel layer 120, the density of the sensing pixels 122 in the pixel layer 120 may be configured according to the required accuracy of spatial positioning, for example, each pixel (for example, including three sub-pixels 121 of GRB) may correspond to one sensing pixel 122, and the drawings of the embodiments of the present disclosure are illustrated by way of example of this configuration. In addition, each pixel may also correspond to two sensing pixels 122, or a plurality of pixels may correspond to one sensing pixel 122, or one or more sub-pixels 121 may correspond to one sensing pixel 122. As an example, one or more sub-pixels 121 may be disposed between adjacent sensing pixels 122. The sensing pixels 122 in the embodiments of the present disclosure may be, for example, photosensitive sensors, and the embodiments of the present disclosure do not limit the density and number of the sensing pixels 122, as long as spatial positioning with the required accuracy can be achieved.

Figure 2:
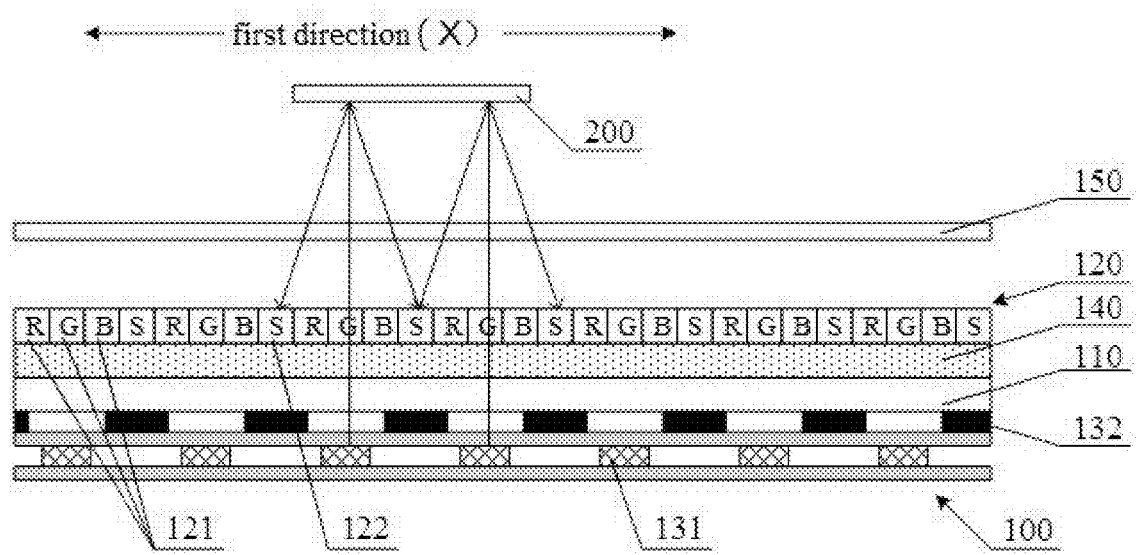
FIG. 2 is a schematic structural diagram of another array substrate according to an embodiment of the present disclosure.

FIG. 2 is a schematic structural diagram of another array substrate according to an embodiment of the present disclosure. Based on the structure of the array substrate 100 shown in FIG. 1, in the array substrate 100 provided in this embodiment, the pixel layer 120 includes the sensing pixels 122 arranged in an array between the pixels, and the light source structure 130 may include light sources 131 arranged in an array and corresponding to the sensing pixels 122 one to one, and a collimating optical layer 132 arranged at the light exit side of the light sources 131, that is, the collimating optical layer 132 is arranged between the light sources 131 and the pixel layer 120.

The light source 131 is used to emit invisible light. The light source 131 in the embodiments of the present disclosure may be, for example, an infrared OLED array, or a micro OLED array.

The collimating optical layer 132 is used to convert invisible light incident on the collimating optical layer 132 into collimation invisible light. The collimating optical layer 132 may be implemented by a collimating thick-hole structure, for example, or by other structures, and the light sources 131 arranged in the array are disposed at a side of the collimating optical layer 132 away from the base substrate 110.

In the embodiment of the present disclosure, the light source structure 130 for emitting collimation invisible light is implemented by using a combination structure of the light sources 131 arranged in an array and the collimating optical layer 132, and since the light source 131 is generally a point light source, the collimating optical layer 132 is disposed at the light exit side of the light source 131 so that the light incident on the collimating optical layer 132 can be converted into collimation light, and thus the purpose that the light source structure 130 emits collimation invisible light is achieved. In addition, the light sources 131 and the sensing pixels 122 in the pixel layer 120 may be arranged in a one-to-one correspondence relationship, that is, each sensing pixel 122 is mainly configured to receive the reflected light of the collimated invisible light emitted by the light source 131 corresponding thereto, and therefore the accuracy of spatial positioning can be improved.

Based on the array substrate 100 provided in the above embodiments of the present disclosure, an embodiment of the present disclosure further provides a display device, which includes the array substrate 100 in any of the above embodiments of the present disclosure, and a processing element respectively coupled to the light source structure 130 and the sensing pixel 122 in the array substrate 100.

The processing element in the embodiment of the present disclosure is configured to calculate a distance from the object 200 to be positioned to the display device according to the relevant data information of the collimation invisible light emitted by the light source structure 130 and the reflected light of the collimated invisible light reflected by the object 200 to be positioned, which is received by the sensing pixel 122.

In the embodiment of the present disclosure, the processing element is usually implemented by combining hardware and software, and the processing element may be a processor in the display device, for example, an IC chip, and the processor is configured with functional software, which can implement the functions to be implemented by the processing element. In specific implementations, the processing element may calculate the distance from the object 200 to be positioned to the display device according to a round-trip light path through which collimation invisible light emitted by the light source structure 130 reaches the sensing pixel 122 after being reflected by the object 200 to be positioned, for example, the timings at which light is emitted by the light source structure 130 and is received by the sensing pixel 122 may be recorded. It should be understood that the processing element may be coupled to the light source structure 130 to acquire the timing of emitting the collimation invisible light by the light source structure 130, and the processing element may be coupled to the sensing pixel 122, so that when the sensing pixel 122 receives reflected light, the timing of receiving the reflected light may be fed back to the processing element, and the processing element may calculate the distance from the object 200 to be positioned to the display device according to known data information.

In practical applications, the object 200 to be positioned may be a relatively large object, and in the case that the plurality of sensing pixels 122 are arranged to perform spatial positioning, the sensing pixels 122 receive reflected light which is emitted by the light source structure 130 and reflected by the object 200 to be positioned, and the processing element may calculate the spatial position of the object 200 to be positioned according to round-trip light paths through which the reflected light received by the sensing pixels 122 passes.

It should be noted that, the hardware structure of the array substrate 100 of the display device according to the embodiment of the present disclosure may refer to the embodiment shown in FIG. 1 or FIG. 2, and the light source structure 130 and the pixel layer 120 may be disposed at different sides or the same side of the base substrate 110, and the specific disposition manner may be the same as that of the above embodiments. In addition, advantages and benefits of the display device in the embodiment of the present disclosure with respect to the related art are also the same as those in the above embodiments, and thus will not be repeatedly detailed.

In the display device provided by the present disclosure, based on the structural features of the array substrate 100 in the above embodiments, the light source structure 130 may emit collimation invisible light, the sensing pixel 122 may receive reflected light of the collimation invisible light reflected by the object 200 to be positioned, and a processing element coupled to the light source structure 130 and the sensing pixel 122 in the display device may calculate the distance from the object 200 to be positioned to the display device according to the relevant data information of emitting the collimation invisible light by the light source structure 130 and receiving the reflected light by the sensing pixel 122, that is, spatial positioning is implemented. The display device provided by the present disclosure is reasonably reformed through the structure of the conventional display device, and the structure and the function for realizing spatial positioning are integrated in the display device, so that the display device can perform spatial positioning while displaying normally, and the display device is simple in structure and easy to be implemented, and hardware structure for spatial positioning does not additionally occupy space. In addition, the invisible light may be infrared light harmless to human bodies, and 3D display interaction between a user and the display device is facilitated.

In some implementations, in the display device provided by the embodiment of the present disclosure, the light source structure 130 of the array substrate 100 includes light sources 131 and a collimating optical layer 132, a processing element is respectively coupled to each light source 131 in the light source structure 130, the processing element is further configured to modulate invisible light emitted by each light source 131, so that frequencies of the invisible light emitted by light sources 131 of the light source structure 130 in a first direction are different from each other, the sensing pixel 122 is further configured to demodulate the received reflected light to obtain optoelectronic information, and the demodulation frequency of the sensing pixel 122 is the same as the modulation frequency of the corresponding light source 131.

Figure 3:
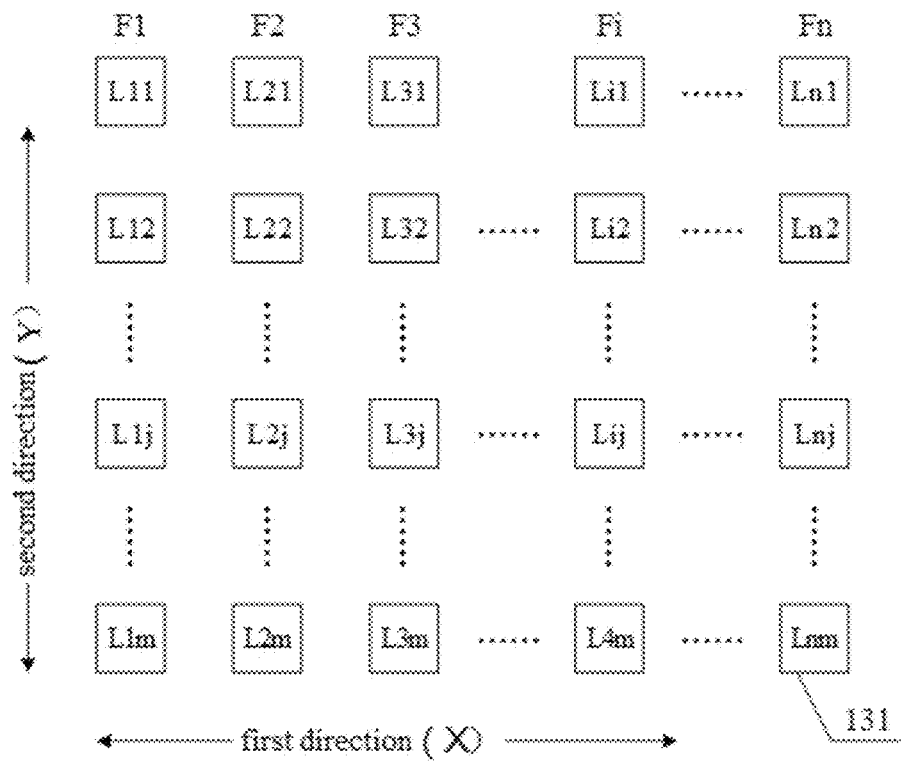
FIG. 3 is a schematic diagram of light sources arranged in an array in a display device according to an embodiment of the present disclosure.

In the embodiment of the present disclosure, the processing element modulates the invisible light emitted by each of the light sources 131 in a first direction (for example, the X-axis direction) of the array substrate 100, so that the frequencies of the invisible light emitted by the light sources 131 in the first direction are different from each other. For example, FIG. 3 is a schematic diagram illustrating light sources arranged in an array in a display device according to an embodiment of the present disclosure, where the light sources 131 in the light source structure 130 are arranged in an n×m array, each line in the first direction includes n light sources 131, each line in the second direction (the second direction is perpendicular to the first direction, e.g., the Y-axis direction) includes m light sources 131, the light sources 131 arranged in the array shown in FIG. 3 are identified by Lij, Lij represents the $i^{th}$ light source 131 in the first direction and the $j^{th}$ light source 131 in the second direction, and after the invisible light emitted by the n light sources 131 in each line in the first direction is modulated by the processing element, the frequencies of the emitted light are respectively F1, F2, . . . , Fi, . . . , and Fn. Accordingly, FIG. 4 is a schematic diagram of a pixel layer in a display device provided in an embodiment of the present disclosure, where FIG. 4 illustrates that each pixel (including three light-emitting sub-pixels 121, i.e., RGB) in the pixel layer 120 corresponds to one sensing pixel 122, the arrangement form of the sensing pixels 122 in the pixel layer 120 is the same as that of the light source 131, and is also in the form of an n*m array, the sensing pixels 122 in the array shown in FIG. 4 are identified by Sij, and the Sij represents the $i^{th}$ sensing pixel 122 in the first direction and the $j^{th}$ sensing pixel 122 in the second direction, that is, the demodulation frequencies of the n sensing pixels 122 in each line along the first direction are F1, F2, . . . , Fi, . . . , and Fn respectively.

Figure 4:
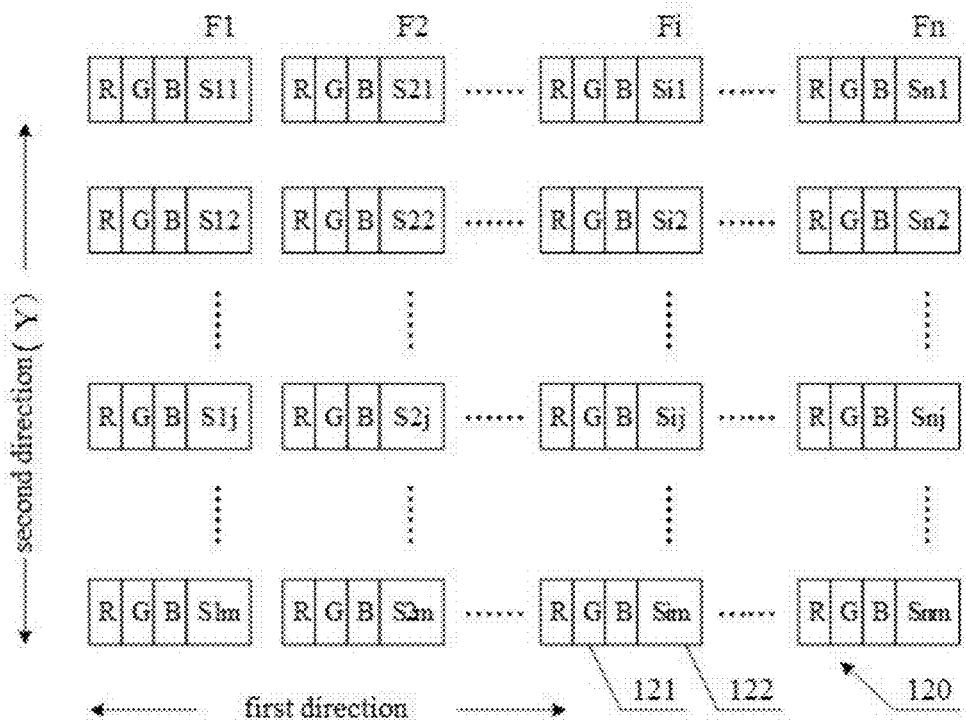
FIG. 4 is a schematic diagram of a pixel layer in a display device according to an embodiment of the present disclosure.

Based on the one-to-one correspondence structural feature of the light sources 131 and the sensing pixels 122 shown in FIG. 3 and FIG. 4, in the embodiment of the present disclosure, after the light sources 131 emit invisible light, reflected light reflected by the object 200 to be positioned is received by the corresponding sensing pixels 122, since the processing element modulates the light emitted by each light source 131, and the modulation frequencies of then light sources 131 in each line along the first direction are different, which is described by taking the $i^{th}$ light source 131 in a certain line along the first direction as an example, the modulation frequency of the light source 131 is Fi, and the sensing pixel 122 corresponding to the light source 131 demodulates the received reflected light with a same frequency (Fi), so as to obtain the optoelectronic information. Therefore, even if n sensing pixels 122 in a line along the first direction perform demodulation at the same time, since the demodulation frequencies thereof are different from each other, i.e., F1, F2, . . . , Fi, . . . , Fn, adjacent sensing pixels 122 do not interfere with each other.

In the embodiment of the present disclosure, the light sources 131 may emit pulse invisible light.

The processing element may be configured to control the sensing pixel 122 to perform a first demodulation and a second demodulation on the received reflected light, where the phase difference between the first demodulation and the second demodulation is ¼ of a pulse period, and in this case, the distance from the object 200 to be positioned to the display device may be calculated according to the following equation (1).

$$2S = \tfrac{1}{4} Fi * c * A/(A+B) \qquad (1)$$

In the above equation (1), S is a distance from the object 200 to be positioned to the display device, Fi is a modulation frequency of the invisible light emitted by the $i^{th}$ light source 131 in the first direction, A is optoelectronic information obtained by the sensing pixel 122 through the first demodulation, B is optoelectronic information obtained by the sensing pixel 122 through the second demodulation, and c is a light speed of the pulse invisible light. It should be noted that, in the calculation of the above equation (1), A and B are optoelectronic information obtained by performing the first demodulation and the second demodulation through a same sensing pixel 122.

In the embodiment of the present disclosure, the light source 131 emits, for example, pulse infrared light, the pulse infrared light is collimated by the collimating optical layer 132 and then irradiates onto the object 200 to be positioned, and then diffuse reflection is generated, and the reflected light is received by the corresponding sensing pixel 122, where it has been described above that the modulation frequency of the processing element on the light emitted by a certain light source 131 is the same as the demodulation frequency of the corresponding sensing pixel 122 for performing demodulation, that is, the sensing pixel 122 can demodulate the reflected light received by the sensing pixel 122 to obtain the optoelectronic information with the corresponding frequency.

Figure 5:
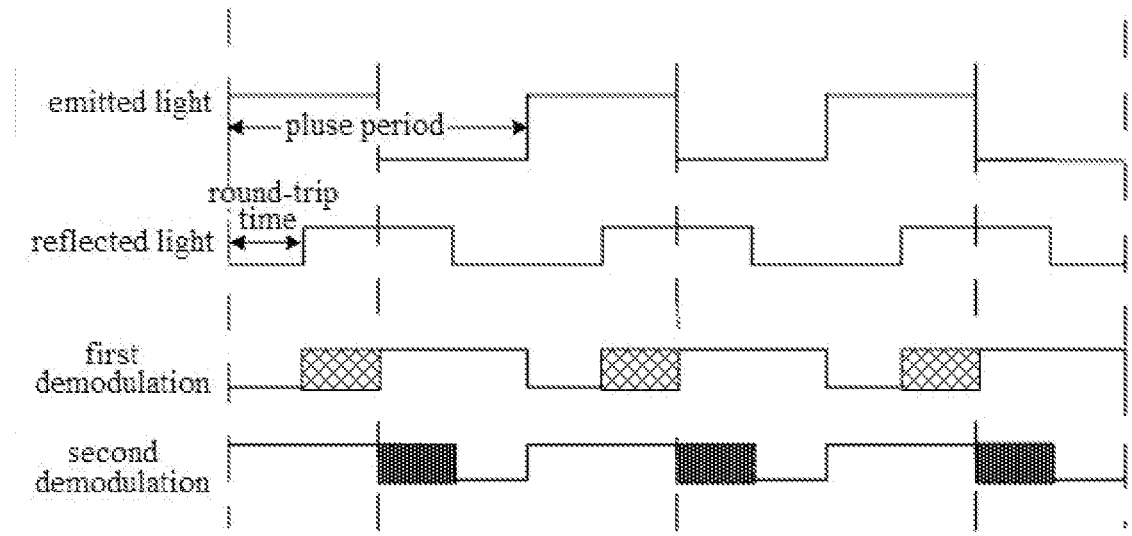
FIG. 5 is a timing diagram of an optical path in a display device according to an embodiment of the present disclosure.

In practical applications, the sensing pixel 122 in the embodiment of the present disclosure may use a multiphase sampling manner to obtain a difference between two samplings by fast sampling, so as to calculate a distance from the object 200 to be positioned to the display device, for example, the difference between the two samplings (corresponding to the first demodulation and the second demodulation) is ¼ of pulse period, FIG. 5 is a timing diagram of a light path in the display device provided in the embodiment of the present disclosure, FIG. 5 shows a pulse period and a timing sequence of the pulse invisible light emitted by the light source 131, a round-trip time experienced by the reflected light, and time periods of the two samplings (demodulation) in each measurement, and it can be seen that the difference between the two samplings is ¼ of the pulse period. The embodiment of the present disclosure can obtain optoelectronic information of a specific frequency (e.g., Fi) at different phases through a multi-phase sampling mechanism inside the sensing pixel 122, so as to obtain a distance between the corresponding light source 131 (light source corresponding to frequency Fi) and the object 200 to be positioned.

It should be noted that, the above sampling manner and the timing diagram shown in FIG. 5 are only used for schematic illustration of the embodiment of the present disclosure, and the embodiment of the present disclosure does not limit the sampling form to be only two samplings, nor does limit that the phase different between the two samplings must be ¼ of the pulse period, and the sampling numbers of the sensing pixel 122 and the time difference between the two samplings may be configured according to actual situations.

Figure 6:
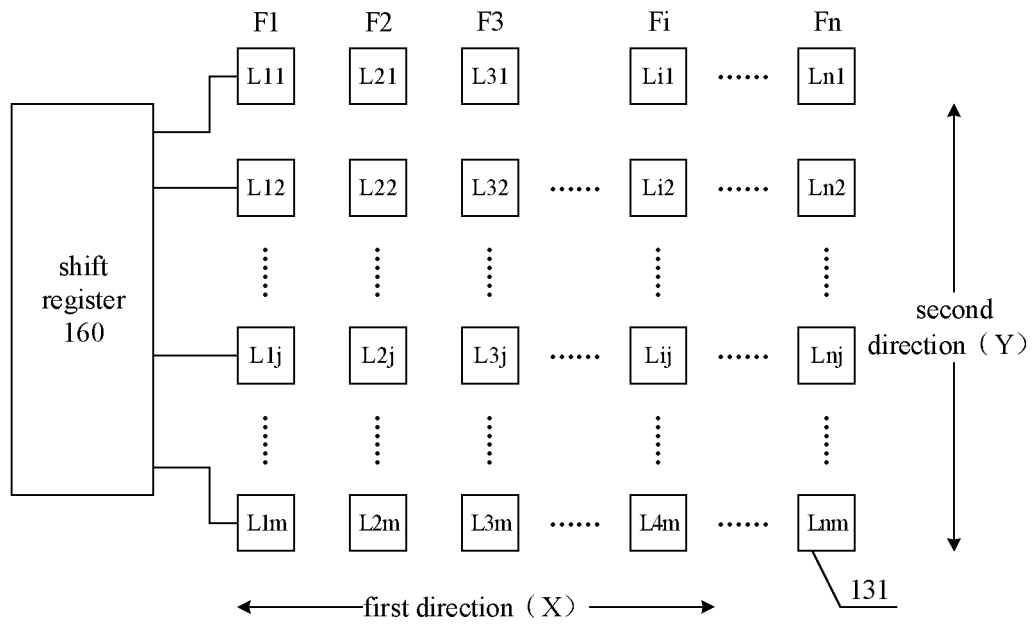
FIG. 6 is a schematic structural diagram of a display device according to an embodiment of the present disclosure.

In the embodiment of the disclosure, the processing element may be further configured to sequentially turn on each line of light sources along the first direction. FIG. 6 is a schematic structural diagram of a display device according to an embodiment of the disclosure. The display device provided by the embodiment of the present disclosure may further include a shift register 160 disposed in the non-display region and coupled to each light source 131, where the shift register 160 is configured to sequentially turn on each line of light sources along the first direction. The display device shown in FIG. 6 shows only the light sources 131 arranged in an array and the shift register 160, FIG. 6 is shown based on the structure of the light sources 131 arranged in an array shown in FIG. 3, and FIG. 6 shows the connection relationship between the shift register 160 and each light source 131 in the m lines of light sources in such a manner that the shift register 160 is coupled to the m lines of light sources 131 in the first direction.

In the embodiment of the present disclosure, the shift register 160 may be disposed in the non-display region around the display region of the array substrate 100, and the shift register 160 is respectively coupled to each light source 131, and in addition, it has been described in the above embodiment that the processing element may be respectively coupled to each light source 131. The shift register 160 (or the processing element) is used in the embodiment of the present disclosure to control the light sources 131 in the light source structure 130 to be turned on in a certain order, for example, to be turned on row by row, or to be turned on column by column, and the modulation frequencies of the light sources that are turned on in the first direction in the same time period are different from each other.

For each line of light sources along the first direction being sequentially turned on in the embodiment of the present disclosure, the sensing pixels 122 may be turned on in any one of the following two ways.

In a first way, the processing element in the embodiment of the present disclosure may be configured to sequentially turn on each line of sensing pixels 122 along the first direction, so that each sensing pixel 122 receives and demodulates the reflected light, which is emitted by the light source 131 corresponding to the sensing pixel and reflected by the object 200 to be positioned.

Based on the implementations of modulation and demodulation in the above-mentioned embodiments of the present disclosure, the lines (rows or columns) of light sources 131 along the first direction in the light source structure 130 are turned on line by line (row by row, or column by column), and the modulation frequencies of each line of light sources 131 that are turned on at the same time are different from each other, so the lines of sensing pixels 122 in the pixel layer 120 along the first direction may be turned on line by line to receive and demodulate the reflected light, that is, the sensing pixels 122 of the corresponding line are turned on when each line of light sources 131 is turned on. For example, the modulation frequencies of the light emitted from the n light sources 131 in each line along the first direction are different from each other, for example, are F1, F2, . . . , Fi, . . . , Fn, respectively, and the demodulation frequencies of the n sensing pixels 122 corresponding to the n light sources 131 are also different from each other, for example, are F1, F2, . . . , Fi, . . . , Fn, respectively.

In a second way, the processing element in the embodiment of the present disclosure may be configured to simultaneously turn on the sensing pixels 122 in a same line along the second direction, the sensing pixel 122 corresponding to each turned-on light source 131 and the sensing pixels 122 in a same line as the corresponding sensing pixel 122 along the second direction simultaneously receive and demodulate the reflected light, which is emitted by each lighting light source 131 and reflected by the object 200 to be positioned, and then the distance from the object 200 to be positioned to the display device may be calculated according to the following equation (2).

$$S=(Si+a1*Si1+a2*Si2+ \ldots ax*Six)/(1+x) \quad (2)$$

In the above equation (2), S is a distance from the object 200 to be positioned to the display device, Si is a distance calculated by the sensing pixel 122 corresponding to the $i^{th}$ turned-on light source 131 in the first direction, Si1 through Six are distances calculated by the sensing pixels 122 in the same line as the corresponding sensing pixel 122 along the second direction, a1 through ax are coefficients for mapping Si1 through Six to Si, respectively, the second direction is perpendicular to the first direction, the frequencies of the invisible light emitted by the light sources 131 of each line along the second direction are the same with each other, x is a positive integer smaller than m−1, and m is the number of the sensing pixels 122 of each line along the second direction.

Figure 7:
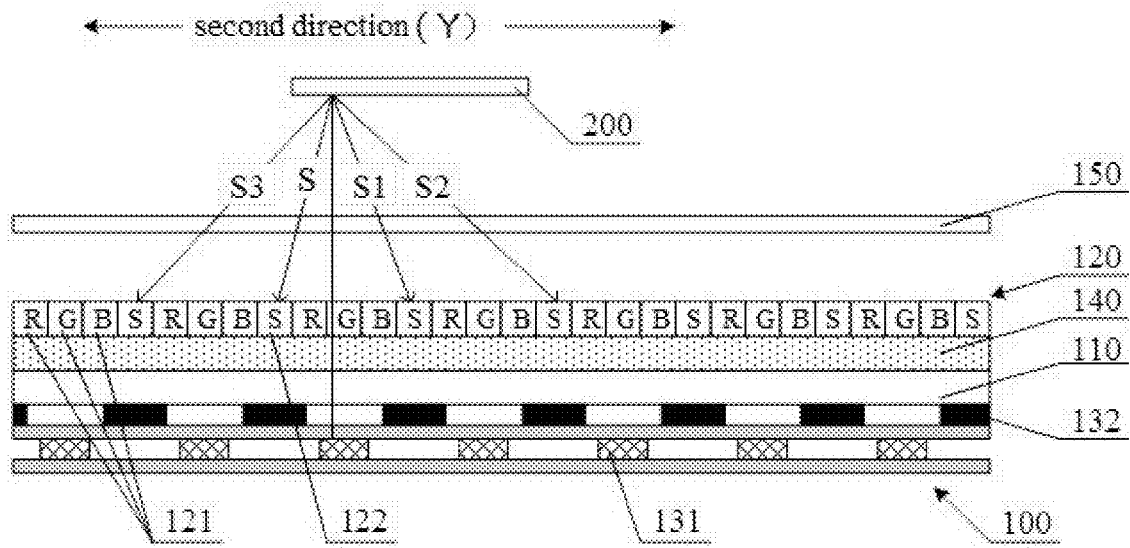
FIG. 7 is a schematic diagram illustrating a principle of implementation of spatial positioning by using a display device according to an embodiment of the present disclosure.

FIG. 7 is a schematic diagram illustrating a principle of implementation of spatial positioning by using a display device provided by an embodiment of the present disclosure, and FIG. 7 only shows a cross-sectional view of the array substrate 100 taken along the second direction. Referring to the structures of the light source 131 and the sensing pixels 122 shown in FIGS. 3 and 4, in the embodiment of the present disclosure, it is assumed that a line of light sources 131 along the first direction, where a light source Lij (indicating that the light source 131 is located at the $i^{th}$ position in the first direction and the $j^{th}$ position in the second direction) is located, are turned on, the invisible light emitted by the light source Lij and reflected by the object 200 to be positioned can be received and demodulated by the sensing pixel Sij (indicating that the sensing pixel 122 is located at the $i^{th}$ position in the first direction and the $j^{th}$ position in the second direction) corresponding to the light source Lij, and in addition, the demodulation frequencies of the sensing pixels 122 (including Si(j−1), Si(j+1), Si(j−2), Si(j+2), etc.) in the same line along the second direction as the sensing pixels Sij are the same as the demodulation frequency of the sensing pixel Sij, and are all Fi, so that the sensing pixels 122 in the same line along the second direction as the sensing pixel Sij can also receive and demodulate the invisible light emitted by the light source Lij and reflected by the object 200 to be positioned, and then the distances calculated by the sensing pixels 122 in the same line as the sensing pixels Sij along the second direction can be mapped to the line along the first direction where the light source Lij is located by calculation, and an average value of the distances is calculated as a final distance value. The embodiment shown in FIG. 7 provides a way to facilitate elimination of jitter of the distance value due to noise.

Based on the display device provided in the foregoing embodiments of the present disclosure, an embodiment of the present disclosure further provides a spatial positioning method of a display device, where the spatial positioning method is performed by using the display device provided in any of the foregoing embodiments of the present disclosure.

Figure 8:
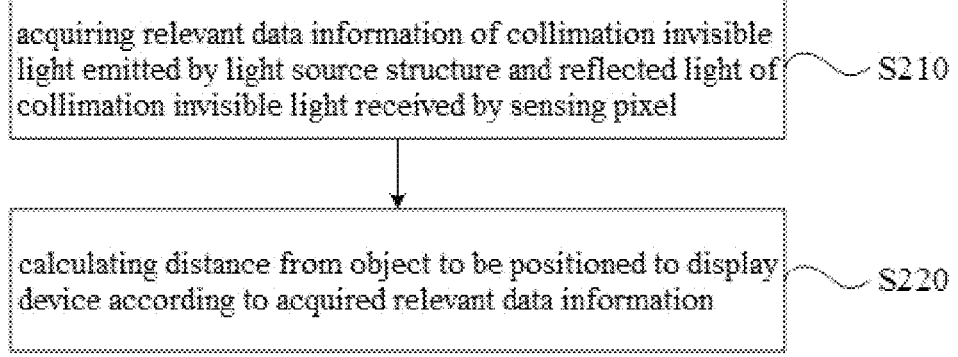
FIG. 8 is a flowchart of a spatial positioning method of a display device according to an embodiment of the present disclosure.

FIG. 8 is a flowchart illustrating a spatial positioning method of a display device according to an embodiment of the present disclosure. The spatial positioning method provided by the embodiment of the present disclosure is performed by a display device, and the method may include steps S210 and S220 as follows.

Step S210, acquiring relevant data information of the collimation invisible light emitted by the light source structure and the reflected light of the collimation invisible light reflected by the object to be positioned, which is received by the sensing pixel.

Step S220, calculating a distance from the object to be positioned to the display device according to the acquired relevant data information.

In an embodiment of the present disclosure, an array substrate of the display device for performing the spatial positioning method may include a base substrate, at least one sensing pixel disposed at a side of the base substrate and arranged in a pixel layer, and a light source structure having a same light exit direction as the pixel layer. The above structure is a hardware basis for the display device to perform spatial positioning, the display device in the embodiment of the present disclosure further includes a processing element for performing program processing, the processing element is respectively coupled to the light source structure and the sensing pixel, and the hardware structure of the display device and the functions realized by each structure can refer to descriptions of the array substrate 100 in the embodiments shown in FIGS. 1 and 2 and the display device in the embodiments shown in FIGS. 3 to 7 of the present disclosure, and therefore are not described herein again.

In the embodiment of the present disclosure, the light source structure may emit collimation invisible light, and the light path, along which the collimation invisible light emitted by the light source structure reaches the sensing pixel after being reflected by the object to be positioned, is the round-trip light path of the collimation invisible light emitted by the light source structure. The steps in the embodiment of the present disclosure are executed by the processing element, that is, the processing element can acquire relevant data information of the collimation invisible light emitted by the light source structure and the reflected light of the collimation invisible light which is reflected by the object to be positioned received by the sensing pixel, so as to calculate the distance from the object to be positioned to the display device according to the round-trip light path of the collimation invisible light emitted by the light source structure, for example, by recording the timings when the collimation invisible light is emitted by the light source structure and the reflected light of the collimation invisible light reflected by the object to be positioned is received by the sensing pixel. It should be appreciated that the processing element may be coupled to the light source structure to acquire the timing at which the collimation invisible light is emitted by the light source structure, the processing element may be coupled to the sensing pixel, and thus when the sensing pixel receives the reflected light, the timing at which the reflected light is received can be fed back to the processing element, and therefore the processing element can calculate the distance from the object to be positioned to the display device according to known data information.

In practical applications, the object to be positioned may be a relatively large object, and the display device may include a plurality of sensing pixels to perform spatial positioning. In such case, the sensing pixels receive the reflected light of the collimation invisible light emitted by the light source structure and reflected by the object to be positioned, and the processing element can calculate the spatial position of the object to be positioned according to the round-trip light path through which the reflected light received by the sensing pixels passes.

Compared with the device for realizing spatial positioning in the related art, the spatial positioning method provided by the embodiment of the present disclosure is executed by the display device integrated with the function for realizing spatial positioning, and the hardware structure for realizing spatial positioning in the display device does not affect the normal display of the display device when executing spatial positioning, and the spatial positioning function is operated independently. The spatial positioning method of the display device provided by the embodiment of the present disclosure is applied to 3D display interaction scenes, such as motion sensing games and other scenes, and no additional hardware facility specially for spatial positioning needs to be arranged, so that on one hand, the cost for additionally configuring the hardware facility is saved, on the other hand, the limitation of the space range on 3D display interaction can be reduced as much as possible, and the practicability of the method is improved.

The spatial positioning method of the display device is based on the hardware configuration of the display device in the above embodiments of the present disclosure, the collimation invisible light is emitted by the light source structure, by acquiring the relevant data information of emitting the collimation invisible light by the light source structure and receiving the reflected light of the collimation invisible light, which is reflected by the object to be positioned, by the sensing pixel, the distance from the object to be positioned to the display device is calculated according to the relevant data information, so that the spatial positioning is realized. According to the spatial positioning method of the display device, the structure and the function of realizing spatial positioning are integrated in the display device through reasonably reforming the structure of the conventional display device, so that the display device can carry out spatial positioning while displaying normally, the structure of the display device is simple and easy to be realized, and hardware structure for spatial positioning does not occupy space additionally. In addition, the invisible light may be infrared light harmless to human bodies, and 3D display interaction between a user and the display device is facilitated.

Figure 9:
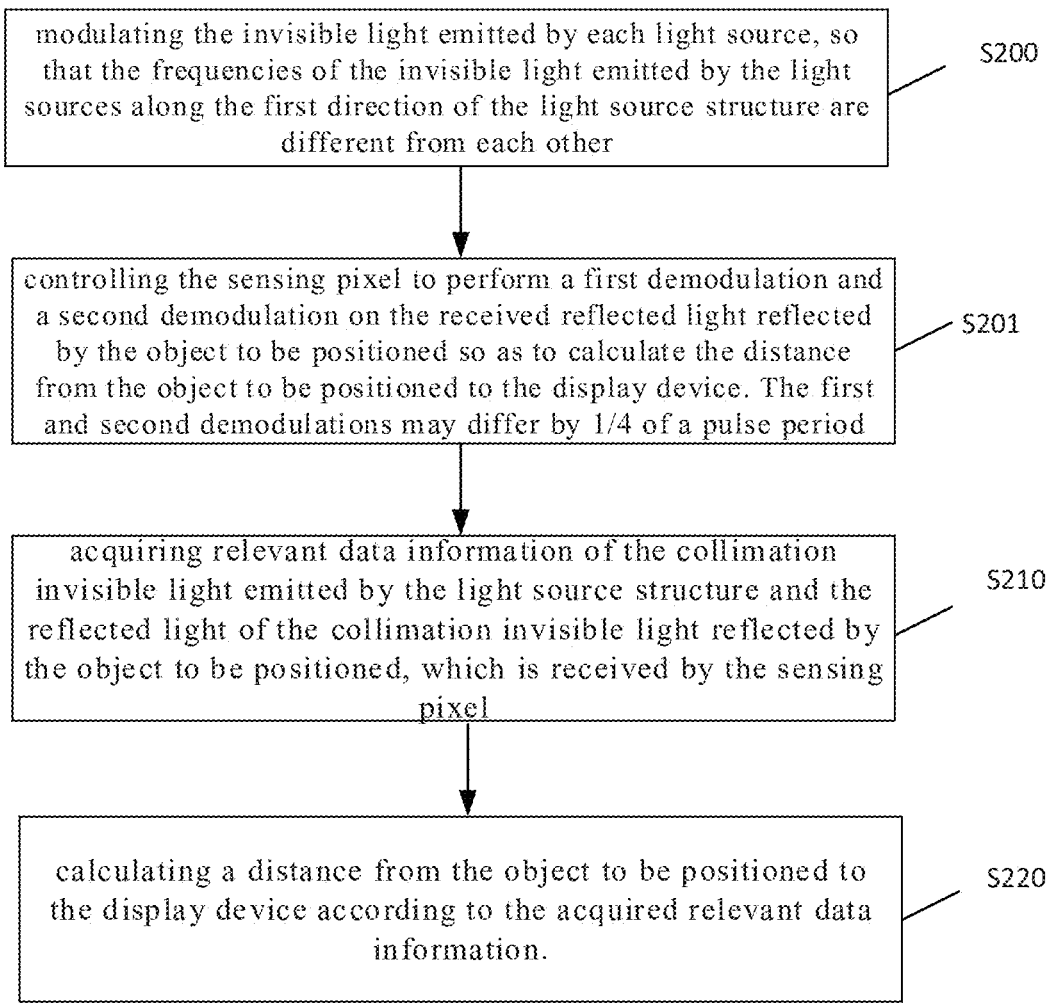
FIG. 9 is a flowchart of another spatial positioning method of a display device according to an embodiment of the present disclosure.

FIG. 9 is a flowchart of another spatial positioning method of a display device according to an embodiment of the present disclosure. In the embodiment of the present disclosure, the pixel layer of the display device may include sensing pixels arranged in an array, the light source structure of the display device may include light sources arranged in an array and corresponding to the sensing pixels one to one, and a collimating optical layer disposed at the light exit side of the light sources, and the collimation invisible light is emitted by using a combined structure of the light sources arranged in an array and the collimating optical layer. On the basis of the embodiment shown in FIG. 8, the method provided in the embodiment of the present disclosure may further include step S200 before step S210.

At Step S200, modulating the invisible light emitted by each light source, so that the frequencies of the invisible light emitted by the light sources along the first direction of the light source structure are different from each other.

In the embodiment of the present disclosure, since the processing element can modulate the invisible light emitted by the light source, and accordingly, the sensing pixel demodulates the received reflected light to obtain the optoelectronic information, the demodulation frequency of the sensing pixel is the same as the modulation frequency of the corresponding light source, and thus the relevant data information of the reflected light received by the sensing pixel, which is acquired by the processing element, includes: the optoelectronic information obtained by demodulating the received reflected light through the sensing pixel. It should be noted that, as for the structures of the light sources arranged in an array and the sensing pixels arranged in an array, reference may be made to FIGS. 3 and 4 in the above embodiments, and the configuration manner of the modulation frequency of the processing element for modulating the invisible light emitted by the light sources and the demodulation frequency of the sensing pixels for demodulating is described in detail in the specific examples shown in FIGS. 3 and 4, and therefore, details are not repeated here.

In embodiments of the present disclosure, the light source may emit pulse invisible light. In this case, the method provided in the embodiment of the present disclosure may further include step S201.

At step S201, controlling the sensing pixel to perform a first demodulation and a second demodulation on the received reflected light reflected by the object to be positioned so as to calculate the distance from the object to be positioned to the display device. The first and second demodulations may differ by ¼ of a pulse period.

The distance from the object to be positioned to the display device may be calculated according to the following equation (1).

$$2S = \tfrac{1}{4} Fi \ast c \ast A/(A+B) \qquad (1)$$

In the above equation (1), S is the distance from the object 200 to the display device, Fi is the modulation frequency of the invisible light emitted from the $i^{th}$ light source 131 in the first direction, A is the optoelectronic information obtained by the first demodulation of the sensing pixel 122, B is the optoelectronic information obtained by the second demodulation of the sensing pixel 122, and c is the light speed of the pulse invisible light. It should be noted that, in the calculation of the above equation (1), A and B are optoelectronic information obtained by performing the first demodulation and the second demodulation through the same sensing pixel, respectively.

In the embodiment of the present disclosure, a timing diagram of two samplings (corresponding to the first demodulation and the second demodulation) performed by the sensing pixel may be referred to that shown in FIG. 5, and the implementation of the two samplings and the calculation of the distance are described in detail in the above embodiments, and therefore will not be described herein again.

Figure 10:
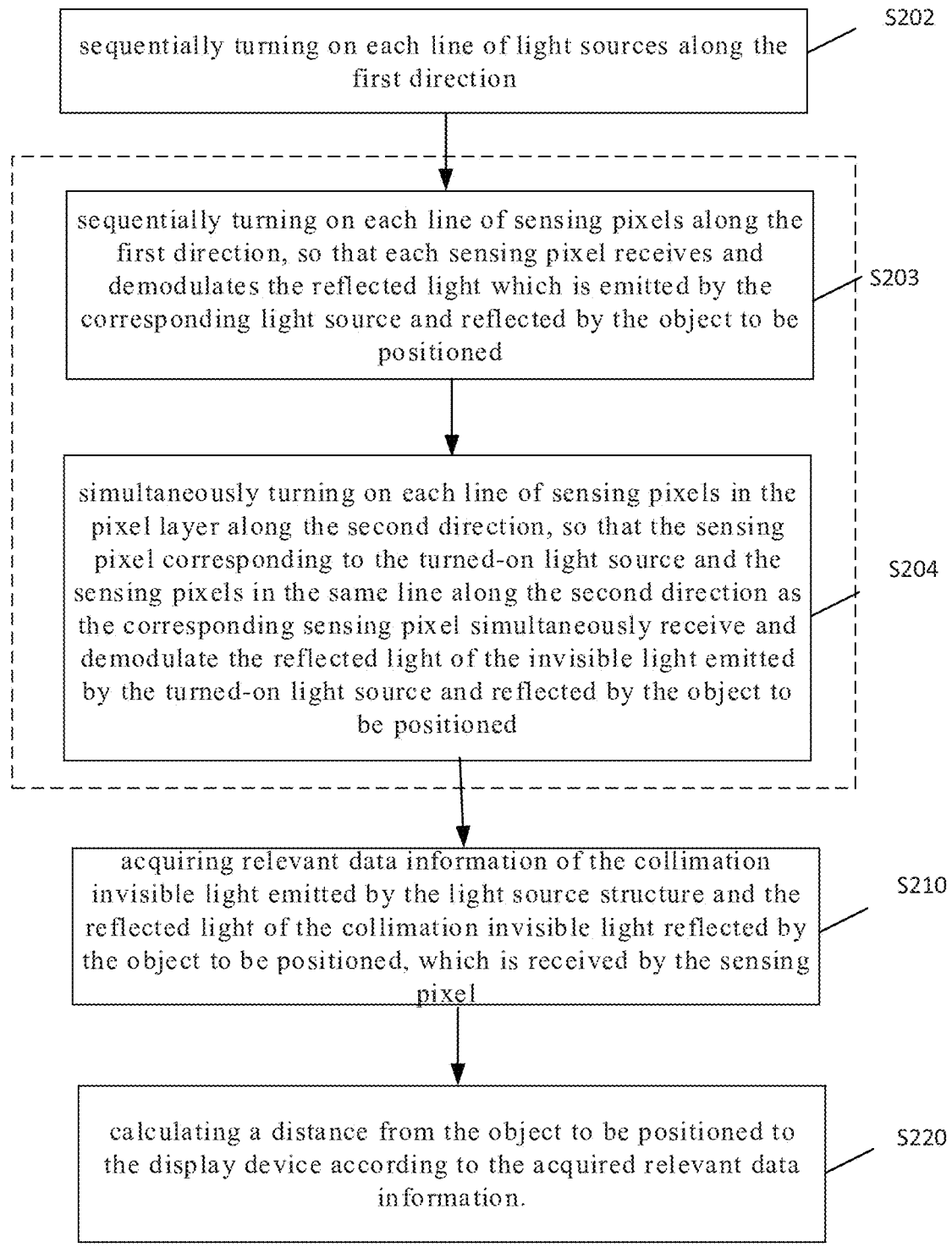
FIG. 10 is a flowchart of further another spatial positioning method of a display device according to an embodiment of the present disclosure.

FIG. 10 is a flowchart of another spatial positioning method of a display device according to an embodiment of the present disclosure. On the basis of the embodiment shown in FIG. 8, the method provided in the embodiment of the present disclosure may further include step S202 before the step S210.

At step S202, sequentially turning on each line of light sources along the first direction.

In the embodiment of the present disclosure, a shift register may be disposed in a non-display area around a display area of the array substrate, and the shift register is respectively coupled to each light source. In addition, the processing element being coupled to each light source has been described above. The step S202 in the embodiment of the present disclosure may be executed by the processing element or the shift register, that is, the shift register (or the processing element) may be used to control the light sources in the light source structure to be turned on in a certain order, for example, to be turned on row by row or to be turned on column by column, where modulation frequencies of a line of light sources along the first direction that are turned on at the same time period are different from each other.

In some implementations of the embodiment of the present disclosure, step S203 may also be included after the step S202.

At the step S203, sequentially turning on each line of sensing pixels along the first direction, so that each sensing pixel receives and demodulates the reflected light which is emitted by the corresponding light source and reflected by the object to be positioned.

In some implementations of the embodiment of the present disclosure, a step S204 may also be included after the step S202.

At the step S204, simultaneously turning on each line of sensing pixels in the pixel layer along the second direction, so that the sensing pixel corresponding to the turned-on light source and the sensing pixels in the same line along the second direction as the corresponding sensing pixel simultaneously receive and demodulate the reflected light of the invisible light emitted by the turned-on light source and reflected by the object to be positioned, and then calculating the distance from the object to be positioned to the display device according to the following equation (2).

$$S=(Si+a1*Si1+a2*Si2+ \ldots ax*Six)/(1+x) \qquad (2)$$

In the above equation (2), S is a distance from the object to be positioned to the display device, $Si$ is a distance calculated by the sensing pixel corresponding to the $i^{th}$ turned-on light source in the first direction, $Si1$ through $Six$ are distances calculated by the sensing pixels in the same line as the corresponding sensing pixel in the second direction, $a1$ through $ax$ are coefficients for mapping $Si1$ through $Six$ to $Si$ respectively, the second direction is perpendicular to the first direction, the frequencies of the invisible light emitted by the light sources of each line in the second direction are the same with each other, x is a positive integer smaller than m−1, and m is the number of the sensing pixels of each line in the second direction.

It should be noted that, the implementation manners of the step S203 and the step S204 have been described in detail in the above embodiments, and are not described herein again. In addition, the steps S203 and S204 are optional in the embodiment shown in FIG. 10, and one of them may be selected to be executed.

Figure 11:
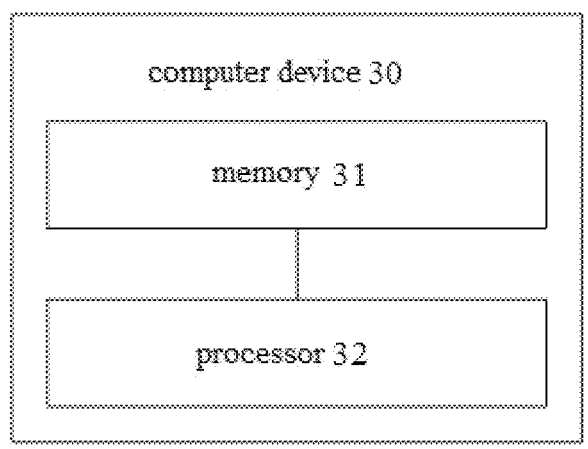
FIG. 11 is a schematic structural diagram of a computer device according to an embodiment of the present disclosure.

FIG. 11 is a schematic structural diagram of a computer device according to an embodiment of the present disclosure. The computer device 30 provided by the embodiment of the present disclosure may include a memory 31 and a processor 32.

The memory 31 is configured to store executable instructions.

The processor 32 is configured to implement the spatial positioning method of the display device provided in any of the above embodiments of the present disclosure when executing the executable instructions stored in the memory 31.

The implementation of the computer device 30 provided in the embodiment of the present disclosure is substantially the same as the implementation of the spatial positioning method of the display device provided in the above embodiments of the present disclosure, and details are not repeated herein.

The embodiment of the present disclosure further provides a computer-readable storage medium, where the computer-readable storage medium stores executable instructions, and when the executable instructions are executed, the spatial positioning method of the display device according to any one of the above embodiments of the present disclosure may be implemented. The implementation of the computer-readable storage medium provided in the embodiment of the present disclosure is substantially the same as the implementation of the spatial positioning method of the display device provided in the above embodiments of the present disclosure, and details are not repeated herein.

Although the embodiments of the present disclosure are described above, the description is only for the purpose of illustrating exemplary embodiments for the understanding of the present disclosure, and is not intended to limit the present disclosure. It should be understood by those skilled in the art that various changes in form and details may be made therein without departing from the scope of the present disclosure, and that the scope of the present disclosure is to be limited only by the terms of the appended claims.

The invention claimed is:

1. An array substrate, comprising a base substrate, a pixel layer arranged at a side of the base substrate, and a light source structure having the same light exit direction as the pixel layer,
    the light source structure is configured to emit collimation invisible light,
    the pixel layer comprises a plurality of sub-pixels and at least one sensing pixel arranged between the sub-pixels, and the at least one sensing pixel is configured to receive reflected light of the collimation invisible light emitted by the light source structure and reflected by an object to be positioned so as to determine a position of the object to be positioned,
    wherein the pixel layer comprises a plurality of sensing pixels arranged in an array between the plurality of sub-pixels, the light source structure comprises a plurality of light sources arranged in an array and corresponding to the plurality of sensing pixels one to one, and a collimating optical layer disposed at a light exit side of the plurality of light sources,
    the plurality of light sources are configured to emit invisible light,
    the collimating optical layer is configured to convert the invisible light incident to the collimating optical layer into the collimation invisible light.

2. The array substrate of claim 1, wherein the light source structure and the pixel layer are respectively disposed at different sides of the base substrate, and the light source structure, the base substrate and the pixel layer are sequentially disposed along a light exit direction of the light source structure.

3. A display device, comprising the array substrate of claim 1, and a processing element respectively coupled to the light source structure and the sensing pixel in the array substrate,
    the processing element is configured to calculate a distance from the object to be positioned to the display device according to relevant data information of the collimation invisible light emitted by the light source structure and the reflected light of the collimation invisible light reflected by the object to be positioned, which is received by the sensing pixel.

4. The display device of claim 3, wherein the pixel layer of the array substrate includes a plurality of sensing pixels arranged in an array between the plurality of sub-pixels, the light source structure includes a plurality of light sources arranged in an array and corresponding to the plurality of sensing pixels one to one, and a collimating optical layer arranged at a light exit side of the plurality of light sources, the plurality of light sources are configured to emit invisible light, the collimating optical layer is configured to convert the invisible light incident on the collimating optical layer into collimation invisible light, the processing element is coupled to each of the light sources of the light source structure, the processing element is further configured to modulate the invisible light emitted by each of the light sources such that frequencies of the invisible light emitted by the respective light sources of each line of the light source structure along the first direction are different from each other, the sensing pixels are further configured to demodulate the received reflected light to obtain optoelectronic information, and a demodulation frequency of the sensing pixel is the same as a modulation frequency of the corresponding light source.

5. The display device of claim 4, wherein the light source is configured to emit pulse invisible light, the processing element is configured to control the sensing pixel to perform a first demodulation and a second demodulation on received reflected light, and a phase difference between the first demodulation and the second demodulation is ¼ of a pulse period, so that a distance from the object to be positioned to the display device is calculated according to $2S=\frac{1}{4}Fi*c*A/(A+B)$, where S is the distance from the object to be positioned to the display device, Fi is the modulation frequency of invisible light emitted by an ith light source in the first direction, A is optoelectronic information obtained by performing the first demodulation through the sensing pixel, B is optoelectronic information obtained by performing the second demodulation through the sensing pixel, and c is a light speed of the pulse invisible light.

6. The display device of claim 4, wherein the processing element is further configured to sequentially turn on each line of light sources along the first direction.

7. The display device of claim 4, further comprising:

a shift register arranged in a non-display area and coupled with each light source, and is configured to sequentially turn on each line of light sources along the first direction.

8. The display device of claim 6, wherein the processing element is further configured to sequentially turn on each line of sensing pixels along the first direction, so that each sensing pixel receives and demodulates the reflected light of the invisible light emitted by the corresponding light source and reflected by the object to be positioned.

9. The display device of claim 6, wherein the processing element is further configured to turn on the sensing pixels of a same line along the second direction simultaneously, so that the sensing pixel corresponding to the turned-on light source and the sensing pixels of the same line along the second direction as the corresponding sensing pixel simultaneously receive and demodulate the reflected light of the invisible light emitted by the turned-on light source and reflected by the object to be positioned, so as to calculate the distance from the object to be positioned to the display device according to $S=(Si+a1*Si1+a2*Si2+ \ldots +ax*Six)/(1+x)$, where S is the distance from the object to be positioned to the display device, Si is the distance calculated by the sensing pixel corresponding to the ith turned-on light source in the first direction, Si1 through Six are distances calculated by the sensing pixels in the same line as the corresponding sensing pixel along the second direction, and a1 through ax are coefficients for mapping Si1 through Six to Si, respectively, the second direction is perpendicular to the first direction, and frequencies of the invisible light emitted by the light sources in each line along the second direction are the same with each other.

10. A spatial positioning method of a display device, wherein an array substrate of the display device comprises a base substrate, at least one sensing pixel arranged at a side of the base substrate and in a pixel layer, and a light source structure having the same light exit direction as the pixel layer, the method comprises steps of:

acquiring relevant data information of collimation invisible light emitted by the light source structure and reflected light, which is received by the at least one sensing pixel, of the collimation invisible light reflected by an object to be positioned; and calculating a distance from the object to be positioned to the display device according to the acquired data information, wherein the pixel layer comprises a plurality of sensing pixels arranged in an array between a plurality of sub-pixels, the light source structure comprises a plurality of light sources arranged in an array and corresponding to the sensing pixels one to one, and a collimating optical layer disposed at a light exit side of the light sources, and the method further comprises:

modulating the invisible light emitted by each of the light sources such that frequencies of the invisible light emitted by the respective light sources of the light source structure in a first direction are different from each other, wherein the acquired relevant data information of the reflected light received by the sensing pixel comprises optoelectronic information obtained by demodulating the received reflected light by the sensing pixel.

11. The method of claim 10, wherein the light source emits pulse invisible light, the method further comprises:

controlling the sensing pixel to perform a first demodulation and a second demodulation on the received reflected light, wherein a phase difference between the first demodulation and the second demodulation is ¼ of a pulse period, and calculating the distance from the object to be positioned to the display device according to $2S=\frac{1}{4}Fi*c*A(A+B)$, wherein S is the distance from the object to be positioned to the display device, Fi is a modulation frequency of invisible light emitted by the ith light source in the first direction, A is optoelectronic information obtained by performing the first demodulation through the sensing pixel, B is optoelectronic information obtained by performing the second demodulation through the sensing pixel, and c is a light speed of the pulse invisible light.

12. The method of claim 10, further comprising:

sequentially turning on each line of light sources along the first direction.

13. The method of claim 12, further comprising:

sequentially turning on each line of sensing pixels along the first direction, so that each sensing pixel receives and demodulates the reflected light of the invisible light emitted by the corresponding light source and reflected by the object to be positioned.

14. The method of claim 12, further comprising:

simultaneously turning on the sensing pixels of a same line along a second direction, so that the sensing pixel corresponding to the turned-on light source and the sensing pixels of the same line along the second direction as the corresponding the sensing pixel simultaneously receive and demodulate the reflected light of the invisible light emitted by the turned-on light source and reflected by the object to be positioned, and calculating the distance from the object to be positioned to the display device according to $S=(Si+a1*Si1+a2*Si2+\ldots+ax*Six)/(1+x)$, wherein S is the distance from the object to be positioned to the display device, Si is the distance calculated by the sensing pixel corresponding to the ith turned-on light source in the first direction, Si1 through Six are distances calculated by the sensing pixels of the same line along the second direction as the corresponding sensing pixel, and a1 through ax are coefficients for respectively mapping Si1 through Six to Si, the second direction is perpendicular to the first direction, and frequencies of the invisible light emitted by the light sources in each line along the second direction are the same with each other.

15. A computer device comprising a memory and a processor, the memory is configured to store executable instructions;
the processor is configured, when executing the executable instructions stored in the memory, to implement a spatial positioning method of a display device according to claim 10.

16. A non-transitory computer-readable storage medium storing executable instructions that, when executed, implement the spatial positioning method of claim 10.

17. The array substrate of claim 1, wherein the light source structure and the pixel layer are respectively disposed at different sides of the base substrate, and the light source structure, the base substrate and the pixel layer are sequentially disposed along a light exit direction of the light source structure.

18. The display device of claim 7, wherein the processing element is further configured to sequentially turn on each line of sensing pixels along the first direction, so that each sensing pixel receives and demodulates the reflected light of the invisible light emitted by the corresponding light source and reflected by the object to be positioned.

* * * * *